(12) United States Patent
Taylor et al.

(10) Patent No.: US 6,309,528 B1
(45) Date of Patent: Oct. 30, 2001

(54) SEQUENTIAL ELECTRODEPOSITION OF METALS USING MODULATED ELECTRIC FIELDS FOR MANUFACTURE OF CIRCUIT BOARDS HAVING FEATURES OF DIFFERENT SIZES

(75) Inventors: E. Jennings Taylor, Troy; Jenny J. Sun, Tipp City; Maria E. Inman, Englewood, all of OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

(21) Appl. No.: 09/419,881

(22) Filed: Oct. 18, 1999

Related U.S. Application Data
(60) Provisional application No. 60/159,541, filed on Oct. 15, 1999.

(51) Int. Cl.[7] ....................................................... C25D 5/18

(52) U.S. Cl. ......................... 205/103; 205/123; 205/125; 205/920

(58) Field of Search ................................... 205/103, 104, 205/123, 125, 126, 920

(56) References Cited

U.S. PATENT DOCUMENTS

| | | | | |
|---|---|---|---|---|
| 3,802,854 | * | 4/1974 | Mueller-Dittmann et al. | 428/686 |
| 4,396,467 | * | 8/1983 | Anthony | 205/103 |
| 4,519,877 | * | 5/1985 | Wiech, Jr. | 205/118 |
| 4,666,567 | * | 5/1987 | Loch | 205/83 |
| 5,863,406 | * | 1/1999 | Mazzoni et al. | 205/126 |
| 5,972,192 | * | 10/1999 | Dubin et al. | 205/101 |
| 5,980,721 | * | 11/1999 | Prevotat et al. | 205/125 |

* cited by examiner

Primary Examiner—Bruce F. Bell
Assistant Examiner—William T. Leader
(74) Attorney, Agent, or Firm—Vorys, Sater, Seymour and Pease LLP (57) ABSTRACT

A continuous layer of a metal is electrodeposited onto a substrate having both hydrodynamically inaccessible recesses and hydrodynamically accessible recesses on its surface by a two-step process in which the hydrodynamically inaccessible recesses are plated using a pulsed reversing current with cathodic pulses having a duty cycle of less than about 50% and anodic pulses having a duty cycle of greater than about 50% and the hydrodynamically accessible recesses are then plated using a pulsed reversing current with cathodic pulses having a duty cycle of greater than about 50% and anodic pulses having a duty cycle of less than about 50%.

23 Claims, 4 Drawing Sheets

SEQUENTIAL ELECTRODEPOSITION OF METALS USING MODULATED ELECTRIC FIELDS FOR MANUFACTURE OF CIRCUIT BOARDS HAVING FEATURES OF DIFFERENT SIZES

RELATIONSHIP TO OTHER APPLICATIONS

This application claims the benefit of U.S. Provisional Application No. 60/159,541, filed on Oct. 15, 1999.

BACKGROUND OF THE INVENTION

1. Field of the Invention

This invention relates to electrodeposition of metals and more particularly to electrochemical metallization of substrates having surface features of different transverse dimensions.

2. Brief Description of the Prior Art

Electronic devices such as computers, cellular telephones, electronic entertainment devices, and the like, have long been manufactured by mounting components on circuit boards having electrically conductive traces thereon to interconnect the components.

In the manufacture of such electronic equipment, development of technology and economics have driven the industry toward ever-smaller devices, containing ever-increasing numbers of components. At the level of semiconductor devices very large scale integration (VLSI) and ultra large scale integration (ULSI), hereafter referred to as simply VLSI, has produced chips containing up to a few million transistors on a single semiconductor chip no larger than several millimeters on a side. Such chips have conventionally been packaged or encapsulated in small modules having external lead wires for interconnecting the chips. The interconnections have conventionally been provided by circuit boards having electrical conductors prepared by so called "printed wiring" techniques that involve masking, etching, and plating of conductive metal, usually copper, to provide the interconnects between chip modules or sockets designed to hold such modules. These "printed wiring boards" (PWB) have typically been used to interconnect chips of conventional sizes. The chips or socket are mounted on the surface of the board with terminals fitted into holes through the board. The holes are typically lined with a thin layer of copper that is integral with the traces of copper on the surface of the board. The terminals of the chips or sockets are soldered to the copper layer lining the holes and thereby interconnected through the copper traces. The PWBs may have copper traces on both sides as well as more than one inner layer of copper traces. Connections between copper traces in the different layers of these double-sided and multileyered PWBs are also provided by copper-lined holes passing through the board, commonly known as plated through-holes (PTHs).

The copper lining in such holes is typically applied electrolytically, by first laying down a thin layer of electroless copper to provide electrical continuity and then electroplating copper to a thickness of a few mils to provide the connecting layer. While the copper could be applied solely using the electroless process, the processing time for the electroless process is significantly greater than the processing time for the electrolytic process. The holes in the PWBs typically are at least 12–13 mils in diameter. Because of the well-known problem of depositing metal electrolytically in recesses, special techniques have to be used to assure that a uniform layer of conductive metal is deposited in the holes. Consequently conventional techniques to enhance the "throwing power" of the electroplating system have been employed, such as agitation of the bath, addition of certain chemical compounds to the electroplating bath, and/or the use of pulsed current plating. Furthermore, while a full-build electroless process can somewhat alleviate the throwing power issue associated with the electrolytic process, the added processing time reduces through-put.

Although conventional techniques have generally been successful in the manufacture of PWBs having the dimensions that have been commonly used in electronic devices such as television receivers, personal computers, and the like, the trend to ever-smaller equipment such as cellular telephones, palm computers, portable global positioning devices, more advanced computers, and the like, has led to the necessity of mounting chips closer together in multichip modules (MCMs). Instead of terminals extending into holes in the circuit board, such MCMs frequently have only metallized locations on a major surface of the module to provide interconnections. The semiconductor devices or chips are placed relatively close together on a substrate having holes drilled therein at the locations of the interconnecting pads on the modules. In such boards the holes are typically of smaller diameter than those of conventional PWBs, and may range from about 25 micrometers (1 mil) to about 250 micrometers (10 mils). Such holes are also effectively blind holes and the conductor deposition step provides the electrical contact to the terminal pads on the semiconductor devices as well as the interconnections between the devices. The use of small chips mounted close together and interconnected by means of conductors deposited in small holes has come to be known as high density interconnect (HDI) technology. With single sided, double sided and multilayers representing the first three generations of PWBs, high density PWBs are also being termed the fourth generation PWB. Other names for this emerging technology includes built-up boards and micro via boards. Other designs for these build up boards involves adding the chip subsequent to processing.

Furthermore, circuit boards having areas of high-density interconnections between micro via layers on either side of the PWB and conventional PWB layers or to semiconductor devices also must have structures adapted to connect the HDI board to other boards or peripheral devices. Such external connections to devices of conventional size are generally made using conventional PWB techniques, e.g., using plated-through holes. Accordingly, a single circuit board level or layer may include both areas of high-density interconnects and areas of conventional PWB connections.

As pointed out above, it has been found that the electroplating conditions suitable for fabricating plated-through holes (PTHs) are not effective to deposit metal into the smaller blind holes and vias found in the HDI areas of the board. Accordingly, the conventional procedure for manufacture of such boards has been to mask either the HDI area or the conventional PTH area of the board and plate each area under conditions appropriate for the size of the holes and recesses in the board. Typically,the full build electroless approach is utilized with the concomitant lengthy processing time and slow throughput. Further, the conditions have included special additives in the plating bath to improve the throwing power in order to promote the deposition of metal in the recesses, vias and holes. The requirement for masking certain areas of the board surface has introduced a number of processing steps, such as applying a photoresist layer, imaging the layer, developing the photoresist, and at least two separate electroplating steps, possibly in baths of different compositions.

Deposition of conductive metal into the small, blind holes or vias used in HDI has presented particular problems. Conventional metallization procedures, such as chemical vapor deposition or physical vapor deposition as well as electroless deposition, are slow and expensive. Electroplating into small blind vias using conventional procedures has not been able to provide a reliable layer of conductive metal in the vias to assure a reliable interconnection of the chips. Such a reliable layer of conductive metal may either be conforming to the via, that is conformal, or in some cases it may be desirable to fill the via. In particular, conventional electroplating techniques tend to deposit excess metal at the sharp corners at the top or entrance of the hole. Such deposits encroach on the opening of the hole and hinder deposition in the lower portion of the hole. They may even completely block the mouth of the hole leading to voids in the vias or interconnects. Furthermore, chemical additives in the plating bath may lead to inclusions of impurities derived from the plating bath within the metal deposit. Such problems can lead to connections that have a high electrical resistance and are mechanically brittle and unreliable in service. In addition, the use of nonconventional electroplating techniques such as pulse current plating, typically in conjunction with chemical additives, has relied on waveform parameters successfully developed for traditional PWB applications, such as 13 mil and greater PTHs. These waveforms generally operate with long cathodic duty cycles and short anodic duty cycles. This approach has led to similar problems encountered in conventional plating with excess metal deposit at the opening of the via leading to voids in the interconnect or to excessive deposit of metal on the surface of the substrate, a condition known to those in the industry as overplate. As well as wasting copper, overplate limits how close features may be placed an is counter to the objective of attaining higher packing densities. In addition to the problems cited above, such nonuniform metallization within the via or between the via and the substrate results in excessive processing time and cost associated with the excess metal.

Accordingly, a need has continued to exist for a method of depositing metallic conductors, especially copper, onto the surface of high-density interconnect boards with adequate deposition of metal into the small vias and recesses of the HDI areas as well as the through holes of the external connection areas.

SUMMARY OF THE INVENTION

The problems of providing adequate metallization of both HDI areas and peripheral connect areas of HDI circuit boards have now been alleviated by the process of this invention, wherein conductive metal is deposited in both the relatively small features of the HDI area and the larger features of the peripheral connect area in a single plating bath. The metal is first deposited in the vias, holes and recesses of the HDI area using a modulated reversing electric current comprised of relatively short cathodic pulses and relatively long anodic pulses. The larger features of the peripheral connect area are then plated using a modulated reversing electric current comprised of relatively long cathodic pulses and relatively short anodic pulses.

Accordingly, it is an object of the invention to provide an electrochemical method for metallizing a substrate having both high-density interconnect areas and conventional printed wiring board areas.

A further object is to provide a method for electrodeposition of a metal into the small recesses of a high density interconnect area as well as in the through holes of a conventional printed wiring board area.

A further object is to provide a method for metallizing high density interconnect areas and printed wiring board areas in a single electroplating bath.

A further object is to provide a method for metallizing high density interconnect areas and printed wiring board areas without masking the areas for separate plating steps.

A further object is to provide a method for metallizing high density interconnect areas and printed wiring board areas without excessive deposition of metal on the surface of the substrate.

Further objects of the invention will become apparent from the description of the invention which follows.

DETAILED DESCRIPTION OF THE INVENTION AND PREFERRED EMBODIMENTS

The method of the invention makes use of the ability to control the deposition of metal into small recesses can be controlled by using a modulated reverse electric field that produces a pulsed reversing current. In general, when pulsed reversing current is used to electroplate a metal on a substrate, a cathodic pulse is applied to the substrate to produce reduction of metal ions and deposition of metal on the substrate. A following anodic pulse may produce oxidation reactions at the substrate, e.g., oxidation of hydrogen produced by the preceding cathodic pulse, and may cause some dissolution of the metal deposited during the cathodic pulse. In addition, the cathodic and anodic pulses may effect the adsorption and desorption phenomena of the various components of the plating bath such as additives and the like. By adjusting the duration, frequency and duty cycle of the anodic and cathodic pulses it is possible to produce a net deposition of metal at selected locations on the substrate. In particular, it is possible to direct the metal into small recesses in the surface or to a general coverage of the surface and large recesses and/or holes in the substrate.

It is believed that the preferential electrodeposition of a metal into relatively small recesses is related to the relative dimensions of the recess and the Nernst diffusion layer, which develops in the electrolyte close to the surface of the substrate. Because the concentration of metal ions in the electrolyte contacting the substrate is depleted by deposition onto the substrate, a concentration gradient develops in the layer of electrolyte adjacent to the substrate surface. In this layer (the Nernst diffusion layer), having a thickness $\delta$, mass transport of metal ions from the bulk electrolyte to the surface takes place by diffusion. The thickness of the Nernst diffusion layer is determined by the vigor of the hydrodynamic agitation of the plating bath, and accordingly its thickness is subject to considerable variation. Under conventional average conditions of agitation in industrial electroplating, the thickness $\delta$ of the Nernst diffusion layer has been determined to be about 75 micrometers. Although the Nernst diffusion layer generally conforms to the profile of the substrate surface, it is evident that for small recesses, i.e., those having transverse dimensions of the order of the thickness of the diffusion layer, or more specifically two times the thickness of the diffusion layer, the layer cannot follow the surface profile. Consequently, these recesses, wherein the metal ions to be deposited must diffuse over distances that are greater than the hydrodynamically defined Nernst diffusion layer, may be said to hydrodynamically inaccessible to the bulk electrolyte. Conversely, those portions of the substrate profile, including larger recesses and holes, wherein the plated metal ions have to traverse only the thickness of the Nernst diffusion layer may be said to be hydrodynamically accessible to the bulk electrolyte.

Evidently, the boundary between hydrodynamically accessible and hydrodynamically inaccessible recess in a substrate surface depends somewhat on the degree of agitation of the electrolyte bath. In conventional electroplating practice, where the thickness of the Nernst diffusion layer may be about 75–100 micrometers, recesses having a transverse dimension of the order of twice the thickness of the Nernst diffusion layer, or perhaps somewhat greater, may be considered to be hydrodynamically accessible to the bulk electrolyte. Consequently, small recesses having transverse dimensions less than about 200–250 micrometers, or perhaps 350 micrometers at the outside, are hydrodynamically isolated. Furthermore, those recesses having relatively large aspect ratios will tend to be relatively hydrodynamically inaccessible, because the diffusion layer simply cannot follow the surface profile. Conversely, recesses having transverse dimensions greater than about 200–250 micrometers may be ordinarily considered to be hydrodynamically accessible to the bulk electrolyte. Although the size limits separating the hydrodynamically inaccessible recesses from the hydrodynamically accessible ones cannot be defined in absolute dimensions, in a given case the dimensional boundary between the hydrodynamically accessible recesses and those that are hydrodynamically inaccessible can be determined, at least by the results of electroplating experiments. Furthermore, in the case of circuit boards having areas of high density interconnections, with relatively small vias, e.g., 75–250 micrometers, and peripheral areas having through-holes and similar features with somewhat larger dimensions, e.g., about 350 micrometers (13–14 mils), the differences between the hydrodynamically accessible and inaccessible features will be evident.

In any case, it is according to the invention to plate the hydrodynamically inaccessible recesses in a first electroplating step using a pulsed reversing current having a relatively short cathodic duty cycle, e.g., less than about 50%, and a relatively long anodic duty cycle, i.e., greater than about 50%. After the hydrodynamically inaccessible recesses, e.g., small vias and holes have been conformally plated or filled with deposited metal, the hydrodynamically accessible recesses and holes are plated with a uniform layer of deposited metal using a pulsed reversing current having a relatively long cathodic duty cycle, i.e., greater than about 50%, and a relatively short anodic duty cycle, i.e., less than about 50%.

In the first step of the process of the invention, a layer of metal, e.g., copper is deposited selectively in the small blind vias of a circuit board having an area of high density interconnections. The procedure is disclosed in copending U.S. patent application Ser. No. 09/231,811 the entire disclosure of which is incorporated herein by reference. The small features plated in the first step of the process of the invention typically have transverse dimensions less than about 350 micrometers, typically between about 5 micrometers and 350 micrometers, and more typically from about 10 micrometers to about 250 micrometers, or from about 25 micrometers to about 250 micrometers, and still more typically from about 50 micrometers to about 150 micrometers.

Figure 1:
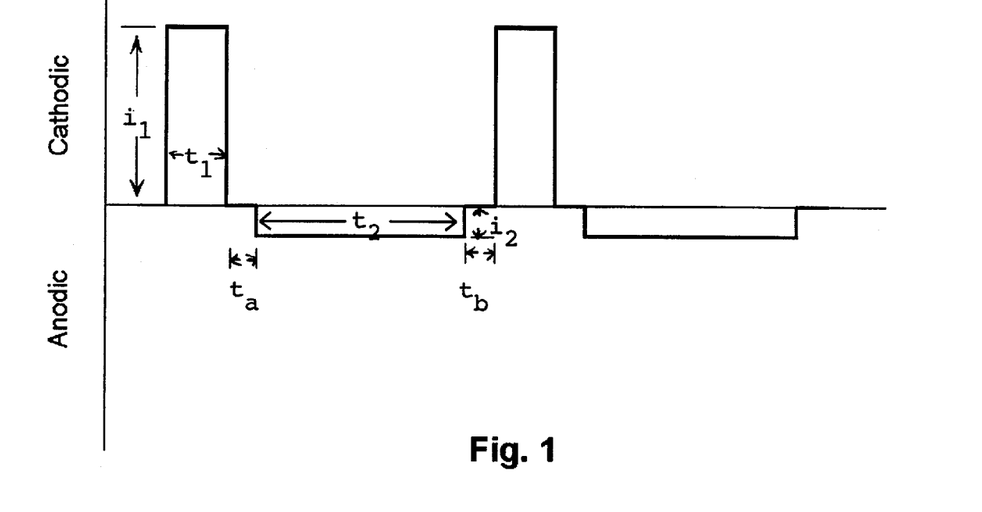
FIG. 1 illustrates the waveform of a modulated reverse electric current used for metallizing the HDI areas of a circuit board in the first step of the method of the invention.

A schematic representation of a rectangular modulated reverse electric field waveform used in the first step of the process of the invention is illustrated in FIG. 1. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in FIG. 1 could represent either current or voltage. Although it is generally more convenient in practice to control the current, alternatively the voltage may be controlled. The technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In FIG. 1, the cathodic peak current is shown as $i_1$ and the cathodic on-time is $t_1$. Similarly, the anodic peak current is shown as $i_2$ and the anodic on-time is $t_2$. The relaxation time, or off-times are indicated by $t_a$, and $t_b$. The sum of the cathodic on-time, anodic on-time, and off-times (if present) is the period T of the pulse train ($T=t_1+t_2+t_a+t_b$), and the inverse of the period of the pulse train (1/T) is the frequency (f) of the pulse train. The ratio of the cathodic on-time to the period ($t_1/T$) is the cathodic duty cycle ($D_1$), and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($i_1T_1$), while the anodic charge transfer density ($Q_2$) is the product of the anodic current density and the anodic on-time ($i_2T_2$). The average current density ($I_{ave}$) is the average cathodic current density ($D_1I_1$) density ($D_1I_1$) minus the average anodic current density ($I_2D_2$). Accordingly the relationships among the parameters may be represented by the following equations.

$$T = \frac{1}{f} = t_1 + t_2 + t_a + t_b \quad (1)$$

$$D_1 = \frac{t_1}{T} \quad (2)$$

$$D_2 = \frac{t_2}{T} \quad (3)$$

$$\frac{Q_1}{Q_2} = \frac{i_1 t_1}{i_2 t_2} \quad (4)$$

$$I_{ave} = i_1 D_1 - i_2 D_2 \quad (5)$$

$$D_1 + D_2 \leq 1 \quad (6)$$

The cathodic duty cycle in the first step of the process of the invention should be relatively short, less than about 50%, and the cathodic pulses should be relatively short, to favor uniform deposition of metal on both the concave (trenches) and convex (peaks) portions of the substrate surface as well as flat portions of the surface. Preferably, the cathodic duty cycle is from about 30% to about 1%, more preferably from about 30% to about 15% and still more preferably from about 30% to about 20%.

Conversely, the anodic duty cycle should be relatively long, greater than about 50%, and the anodic pulses should be relatively long in order to favor removal of excess metal from the convex and peak portions of the substrate surface and the flat portions of the surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current) will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling or uniformly coating the trenches or blind vias required for high density interconnects provide great advantages in the manufacturing process.

The frequency of the pulse train used in the method of the invention may range from about 10 Hertz to about 12000 Hertz, preferably from about 100 Hz to about 10000 Hz, more preferably from about 500 Hz to about 10000 Hz, and still more preferably from about 2000 Hz to about 10000 Hz. More specifically, the frequency of the pulse train used in the first electroplating step of the invention may range from about 10 Hertz to about 12000 Hertz, preferably from about 100 Hertz to about 6000 Hertz, and more preferably from about 500 Hertz to about 4000 Hertz. The frequency of the pulse train used in the second electroplating step of the invention may range from about 10 Hertz to about 5000 Hertz. Accordingly, the cathodic and anodic pulse widths may vary from about 1.0 microsecond to about 100 milliseconds. Generally, as the feature size decreases or the aspect ratio increases, higher frequencies and or lower cathodic duty cycles are preferred. An anodic pulse is introduced between at least some of the cathodic pulses. However, it is not excluded that two or more cathodic pulses may be introduced between a pair of anodic pulses. In particular, a plurality of very short cathodic pulses may be followed by one relatively long anodic pulse. Accordingly, a number of cathodic and anodic pulses with defined pulse widths may make up one group of pulses, which is then repeated. Typically such a group would include one or more cathodic pulses and at least one anodic pulse. The period of a pulse train comprised of such pulse groups may conveniently be defined as the time from the beginning of one cathodic pulse to the beginning of the next cathodic pulse that is similarly situated in the pulse train. The frequency of the pulse train may then be defined as the reciprocal of the period, as discussed above.

The pulse width, duty cycle, and applied voltage of the cathodic and anodic pulses must be adjusted, within the parameters defined for the first step of the process, to provide that the overall process is cathodic, i.e., there is a net deposition of metal on the substrate workpiece. The practitioner will adapt the pulse width, duty cycle, and frequency to a particular application, based on the principles and teachings of the process of the invention.

In the second step of the process of the invention, metal is deposited uniformly over the relatively large features of the substrate and in the through holes that are typically found in circuit board substrates. The waveform of the pulsed reversing current is selected to produce this uniform deposit over the relatively large features.

Figure 2:
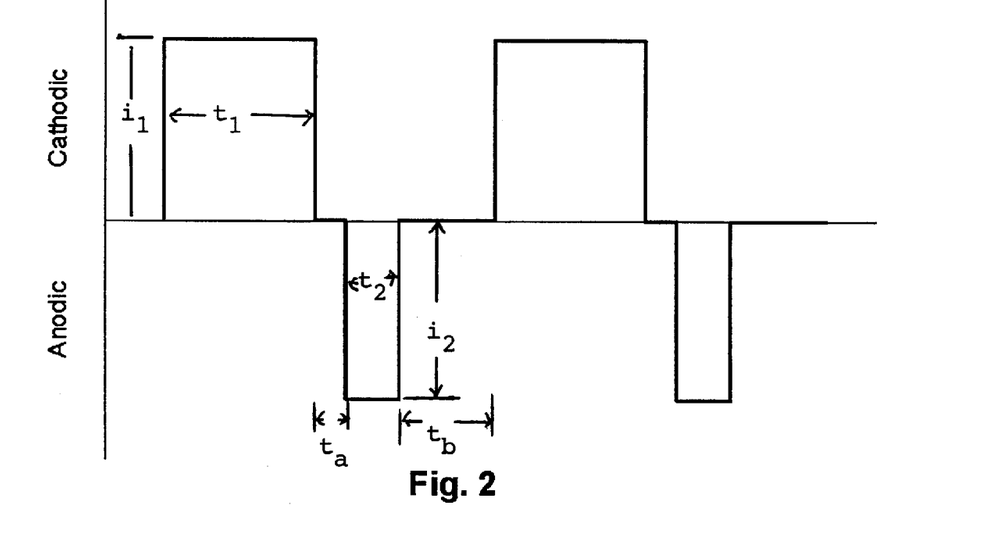
FIG. 2 illustrates the waveform of a modulated reverse electric current used in metallizing the printed wiring board areas of a circuit board in the second step of the method of the invention.

A schematic representation of a rectangular modulated reverse electric field waveform used in the second step of the process of the invention is illustrated in FIG. 2. The definitions of the relevant parameters of the pulse train have been set forth above. In the second step of the process, the cathodic pulse is relatively long and the anodic pulse is relatively short. The relatively long cathodic pulses will deposit metal uniformly over the large features. Such pulses tend to deposit an excess of metal at the corners and peak portions of the substrate. They also tend to deposit excess metal at the corners of the through holes, yielding a so-called "dog-bone" profile.

The relatively short anodic pulses in the second step of the invention tend to remove metal from the corners and peaks of the substrate, thereby compensating for the overplating produced by the cathodic pulses. The result is a smooth uniform coating of metal over the relatively large features of the substrate. Typically, the waveform used in the second step of the plating process of the invention will deposit a uniform coating of metal over features having transverse dimensions of about 350 micrometers or greater, or under come circumstances having features greater than about 250 micrometers. Such dimensions are typical of the through-holes of conventional circuit boards and of the holes placed in the peripheral connecting portions of high density interconnect circuit boards.

Accordingly, the cathodic duty cycle in the second step of the process of the invention is relatively long, more than about 50%, and the anodic pulses should be relatively short, less than that of the cathodic pulse and preferably less than about 50%. Preferably, the cathodic duty cycle is from about 60% to about 99%, more preferably from about 70% to about 85% and still more preferably from about 70% to about 80%.

Conversely, the anodic duty cycle should be relatively short, less than about 50%, and the anodic pulses should be relatively short in order to favor removal of excess metal from the convex and peak portions of the substrate surface. Preferably, the anodic duty cycle is from about 30% to about 1%, more preferably from about 30% to about 15% and still more preferably from about 30% to about 20%. Because the anodic duty cycle is shorter than the cathodic duty cycle, the peak anodic voltage (and corresponding current) may be greater than the peak cathodic voltage (and corresponding current). In any case, the cathodic-to-anodic net charge ratio is adjusted to be greater than one, in order to provide a net deposition of metal on the surface. Although the anodic removal of excess metal reduces the overall efficiency of the electroplating process, the benefits of obtaining a uniform coating over the surface and the through-holes provides a benefit to the manufacturing process.

The method of the invention may be used with any metal that can be deposited by electroplating techniques. Thus copper, silver, gold, zinc, chromium, nickel, tin, lead and alloys thereof such as bronze, brass, solder, and the like, may be deposited by the process of the invention.

Figure 3A:
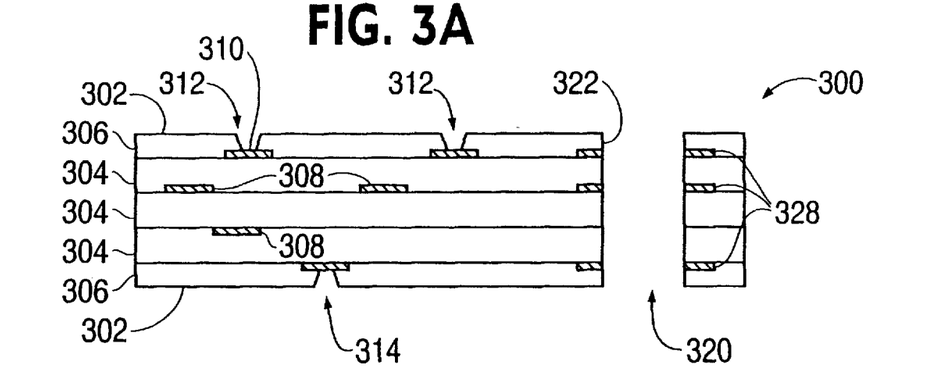
FIG. 3A illustrates a cross section of a circuit board having both an HDI area and a PWB area before the first metallization step of the process of the invention.
Figure 3B:
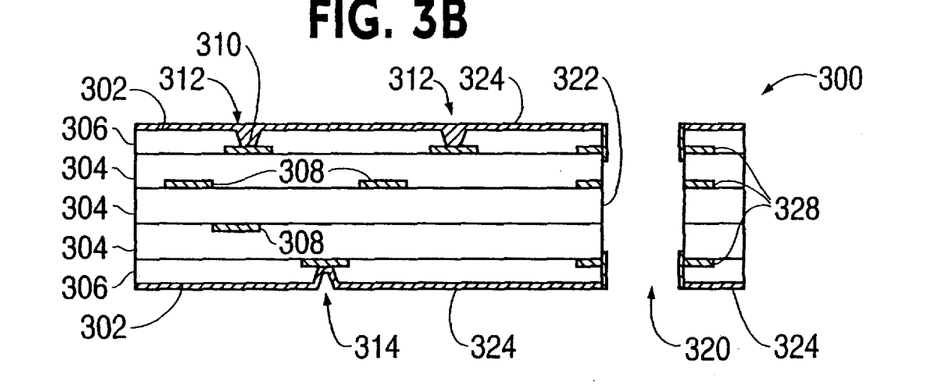
FIG. 3B illustrates a cross section of a circuit board having both an HDI area and a PWB area after the first metallization step of the process of the invention.
Figure 3C:
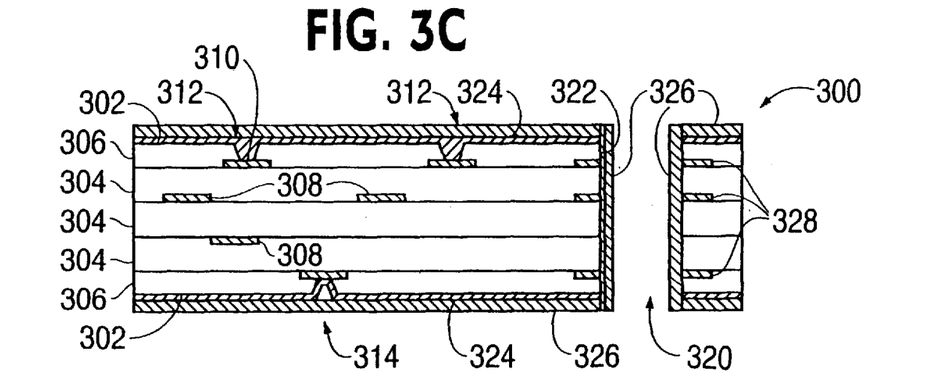
FIG. 3C illustrates a cross section of a circuit board having both an HDI area and a PWB area after the second metallization step of the process of the invention.

The deposition of a metal on a circuit board having both small vias and large through-holes is illustrated in FIGS. 3A–3C.

FIG. 3A illustrates a cross section of a multi-layer circuit board 300 having features of different sizes to be plated with metal by the process of the invention. The surfaces 302 of the board 300 are to be plated with an electrically conductive metal, e.g., copper, which can be subsequently masked and etched to provide conductive traces on the surfaces 302 of the board 300. The illustrated board has five layers of dielectric material 304, 306, although it will be understood by those skilled in the art that boards having any conventional number of layers can be used. Typically the inner dielectric layers 304 will be a reinforced material such as glass fiber reinforced epoxy resin. The outer layers 306 may be an unreinforced material, e.g., unreinforced epoxy resin, to permit easier drilling of vias. The board 300 may contain a number of conducting paths formed at the interfaces between the layers 304, 306. These conductors are shown in cross-section as conductors fully buried conductors 308 and conductors 310 to be connected to the surface 302 of the board 300. Vias 312, 314 are formed in the outer dielectric layers 306 to provide for connecting the conductors 310 to pattern of conductive traces on the surface of the finished circuit board. The circuit board 300 may contain through-holes, one of which is shown as 320, which are intended to be metallized to connect the conductors on the surface 302 to buried pads 328.

In order to prepare for the deposition of the copper layer, the surfaces to be plated, e.g., the surfaces 302, the interior surfaces of the vias 312, 314 and the inside of the through-hole 320 are covered with a thin layer of a conductor by conventional procedures, e.g., by sputtering, electroless deposition, or the like.

Circuit board 300 is then immersed in a plating bath containing ions of a metal to be deposited, e.g., copper ions. The plating bath may be any conventional plating bath appropriate for the metal being plated. Typically plating baths for depositing copper contain a copper salt, e.g., copper sulfate, sulfuric acid, a carrier material that is typically a polyethylene glycol, chloride ion, and one or more proprietary additives generally known as brighteners, levelers, and the like, to improve the uniformity, surface finish, and strength of the deposited coating. Although the process of the invention can be carried out using conventional copper plating baths, it has been found that satisfactory copper deposits can be achieved using a bath that does not include the conventional brighteners, levelers, and the like. Accordingly, for electroplating copper onto an HDI substrate, particularly when small traces and vias are to be prepared, it is preferred to avoid conventional additives such as leveling agents and the like, in order to avoid the difficulties of using such additives such as the tight control of concentration of said additives as well as possible inclusion in the plated conductors. A preferred bath for electroplating copper according to the process of the invention is an aqueous acidic copper sulfate bath incorporating about 40 to about 80 g/L of copper sulfate, a molar ratio of sulfuric acid to copper sulfate of about 5:1 to about 8:1, about 5% of polyethylene glycol and about 30 ppm to about 60 ppm of chloride ion.

An electric current is then passed between the circuit board and a counterelectrode immersed in the plating bath by imposing a modulated reversing electric field to deposit the metal, e.g., copper, on the surfaces of the board 300.

In the first step of the process the current is a pulsed reversing current as discussed above, having relatively short cathodic pulses, i.e., having a duty cycle less than about 50%, and long anodic pulses, i.e., having a duty cycle greater than about 50%. Such a pulsed reversing current will produce a layer of plated copper 324 that will provide a conductive path between the vias on the surface 302 of the board 300. By adjusting the time of plating and, if necessary, the peak current, pulse duration, duty cycle and frequency of the modulated reversing current, the deposit in the first step can provide a conformal coating in the vias as shown at 314 or may completely fill the vias, as shown at 312. Both types of coating in the vias are shown for illustrative purposes, although in general only one type will be deposited in a given application of the process.

The pulsed reversing current having the waveform used in the first step of the process will typically deposit a relatively thin layer of conductive metal over the surface 302 of the board 300, and will deposit little or no metal on the inner surface 322 of the through-hole 320. Accordingly, after the vias have been metallized, a second plating step is performed using a waveform that will deposit a uniform layer of conductive metal over the surfaces 302 of the board 300 and also on the interior surface 322 of the through hole 320. As discussed above, the pulsed reversing current used in the second step of the process of the invention comprises cathodic pulses having a relatively long duty cycle, typically greater than about 50% and the anodic pulses have a duty cycle typically greater than about 50%. Preferably the cathodic pulses in the second step of the process have a duty cycle of about 60% to about 99%, more preferably from about 70% to about 95% and still more preferably from about 85% to about 95%. The anodic pulses in the second step of the process preferably have a duty cycle of from about 1% to about 40%, more preferably from about 5% to about 30% and more preferably from about 5% to about 15%. FIG. 3C shows a schematic cross section of the circuit board 300 after the second step of the process. A uniform layer 326 of copper has been deposited over the first layer 324 and onto the inner surface 322 of the through-hole 320. The uniformly plated board 300 can then be masked, imaged and etched by conventional procedures to provide conductive traces on the surfaces 302 of the board 300.

EXAMPLE

This example illustrates the preparation of a substrate having filled vias and a uniform surface deposit of copper by the process of the invention.

In order to provide a substrate having vias and through holes similar to those found in a multi-layer circuit board, small blind holes having a diameter of about 75–100 micrometers were drilled in the surface of a brass panel having dimensions of 18 inches×8 inches using a laser. Through holes having a diameter of about 325 micrometers were also made in the plate using a mechanical drill. The plate was mounted in a conventional industrial circuit board electroplating apparatus and plated in two steps according to the invention. The plating bath had the following composition: 60–65 g/L of copper sulfate, 166 g/L of sulfuric acid, about 50 parts per million (ppm) of chloride ion, and about 300 ppm of polyethylene glycol (PEG).

In the first step of the plating process the pulsed reversing electric current had the following characteristics:

cathodic duty cycle, 33%; anodic duty cycle, 67%; average cathodic current density, 25 amperes per square foot (ASF), frequency of pulse train, about 333 Hz, and cathodic/anodic charge ratio ($Q_c/Q_a$), 2.5. The plating was conducted for a period of 3 hours in the first step.

The second step of the plating process was then conducted by merely changing the waveform of the plating current. The bath was not changed, the board was not removed from the plating apparatus and no other processing steps were conducted.

In the second step of the plating process the pulsed reversing electric current had the following characteristics: cathodic duty cycle, 90%; anodic duty cycle, 10%; average cathodic current density, 25 amperes per square foot (ASF), frequency of pulse train, about 100 Hz, and cathodic/anodic charge ratio ($Q_c/Q_a$) 10. The plating was conducted for a period of 1 hour in the second step.

Figure 4:
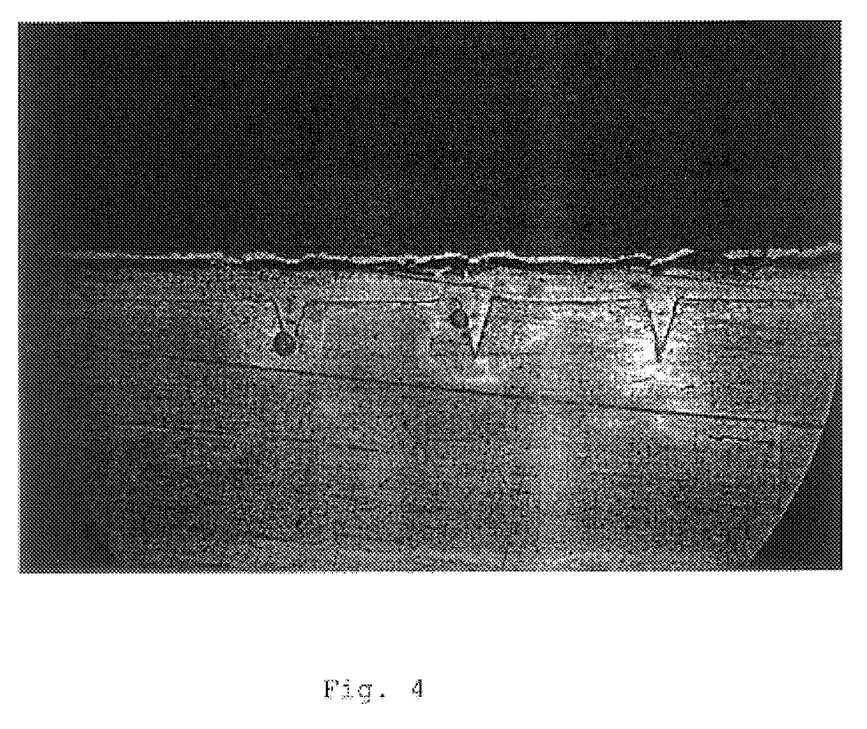
FIG. 4 is a photomicrograph of a cross section of a brass substrate having vias with a transverse dimension of about 75–100 micrometers after a first plating step according to the process of the invention.
Figure 5:
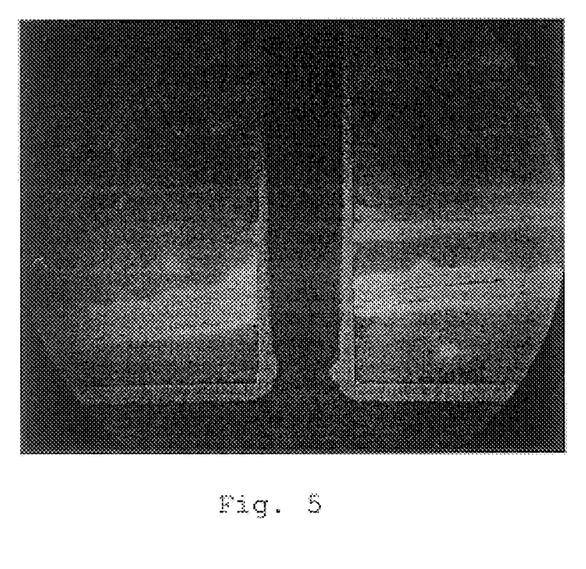
FIG. 5 is a photomicrograph of a cross-section of the brass substrate having a through-hole with a diameter of about 325 micrometers at one end of the hole after the substrate has been treated with both steps of the process of the invention.
Figure 6:
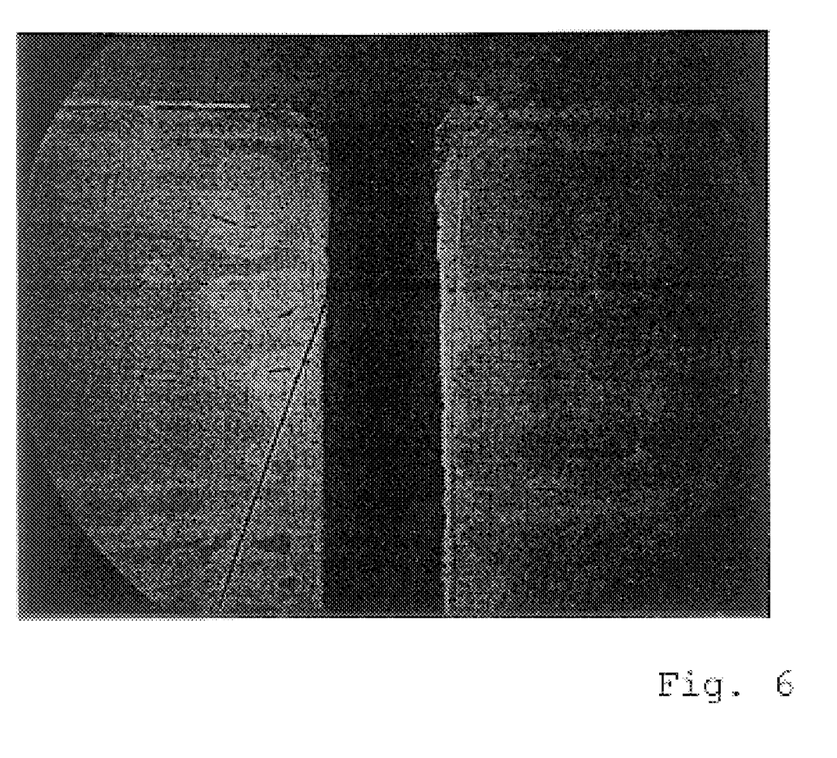
FIG. 6 is a photomicrograph of a cross-section of the brass substrate having a through-hole with a diameter of about 325 micrometers at the other end of the hole after the substrate has been treated with both steps of the process of the invention.

The results achieved are illustrated in FIGS. 4–6. FIG. 4 is a photomicrograph of a cross-section of the plated substrate showing the vias filled with deposited copper. (Certain defects in the brass test panel are also visible.) FIGS. 5 and 6 are photomicrographs showing cross sections of the substrate at each end of the through hole showing a generally uniform plating of the surface of the substrate and the interior surface of the through-hole, with minimum excessive plating ("dogboning") at the edge of the hole.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a continuous layer of a metal onto a substrate having both hydrodynamically inaccessible recesses and hydrodynamically accessible recesses on its surface comprising immersing as an electrode an electrically conductive substrate having a generally smooth surface having both at least one hydrodynamically inaccessible recess and at least one hydrodynamically accessible recess in said surface in an electroplating bath containing ions of a metal to be deposited onto said surface, immersing a counter electrode in said plating bath, in a first electroplating step, passing a first modulated reversing electric current between said electrodes, wherein said first modulated reversing electric current comprises first cathodic pulses and first anodic pulses, said first cathodic pulses have a duty cycle less than about 50% and said first anodic pulses have a duty cycle greater than about 50%, the charge transfer ratio of said first cathodic pulses to said first anodic pulses is greater than one, and the frequency of said first pulses ranges from about 10 Hertz to about 12000 Hertz; and in a second electroplating step, passing a second modulated reversing electric current between said electrodes, wherein said second modulated reversing electric current comprises second cathodic pulses and second anodic pulses, said second cathodic pulses have a duty cycle greater than about 50% and said second anodic pulses have a duty cycle less than about 50%, the charge transfer ratio of said second cathodic pulses to said second anodic pulses is greater than one, and the frequency of said second pulses ranges from about 10 Hertz to about 5000 Hertz.

2. The method of claim 1 wherein an interval of no electric current flow is interposed between said cathodic pulses and succeeding anodic pulses in said first and second electroplating steps.

3. The method of claim 1 wherein an interval of no electric current flow is interposed between said anodic pulses and succeeding cathodic pulses in said first and second electroplating steps.

4. The method of claim 1 wherein an interval of no electric current flow is interposed between said cathodic pulses and succeeding anodic pulses and between said anodic pulses and succeeding cathodic pulses in said first and second electroplating steps.

5. The method of claim 1 wherein, in said first electroplating step, said cathodic pulses and said anodic pulses succeed each other without intervening intervals of no electric current flow.

6. The method of claim 1 wherein, in said first electroplating step, said cathodic pulses and said anodic pulses form a pulse train having a frequency between about 50 Hertz and about 10000 Hertz.

7. The method of claim 1 wherein, in said first electroplating step, said cathodic pulses and said anodic pulses form a pulse train having a frequency between about 100 Hertz and about 6000 Hertz.

8. The method of claim 1 wherein, in said first electroplating step, said cathodic pulses and said anodic pulses form a pulse train having a frequency between about 500 Hertz and about 4000 Hertz.

9. The method of claim 1 wherein, in said first electroplating step, said cathodic pulses have a duty cycle of from about 30% to about 1%.

10. The method of claim 1 wherein, in said first electroplating step, said cathodic pulses have a duty cycle of from about 30% to about 15%.

11. The method of claim 1 wherein, in said first electroplating step, said cathodic pulses have a duty cycle of from about 30% to about 20%.

12. The method of claim 1 wherein, in said first electroplating step, said anodic pulses have a duty cycle of from about 60% to about 99%.

13. The method of claim 1 wherein, in said first electroplating step, said anodic pulses have a duty cycle of from about 70% to about 85%.

14. The method of claim 1 wherein, in said first electroplating step, said anodic pulses have a duty cycle of from about 70% to about 80%.

15. The method of claim 1 wherein said metal is selected from the group consisting of copper, silver, gold, zinc, chromium, nickel, tin, lead, bronze, brass, solder, and alloys thereof.

16. The method of claim 1 wherein, in said first electroplating step, a layer of metal of substantially uniform thickness is deposited on said surface and within said hydrodynamically isolated recess.

17. The method of claim 1 wherein, in said first electroplating step, the thickness of the metal layer deposited within said hydrodynamically isolated recess is greater than the thickness of the metal layer deposited on said surface.

18. The method of claim 1 wherein, in said first electroplating step, said hydrodynamically isolated recess is substantially filled with metal.

19. The method of claim 1 wherein said hydrodynamically inaccessible recess has at least one transverse dimension not greater than about 350 micrometers.

20. The method of claim 1 wherein at least one transverse dimension of said hydrodynamically inaccessible recess is from about 5 micrometers to about 350 micrometers.

21. The method of claim 1 wherein at least one transverse dimension of said hydrodynamically inaccessible recess is from about 10 micrometers to about 250 micrometers.

22. The method of claim 1 wherein at least one transverse dimension of said hydrodynamically inaccessible recess is from about 25 micrometers to about 250 micrometers.

23. The method of claim 1 wherein at least one transverse dimension of said hydrodynamically inaccessible recess is from about 50 micrometers to about 150 micrometers.

* * * * *